United States Patent [19]

Longerich

[11] Patent Number: 4,891,688

[45] Date of Patent: Jan. 2, 1990

[54] VERY HIGH-ACCELERATION TOLERANT CIRCUIT CARD PACKAGING STRUCTURE

[75] Inventor: Ernest P. Longerich, Chatsworth, Calif.

[73] Assignee: Hughes Aircraft Company, Los Angeles, Calif.

[21] Appl. No.: 146,634

[22] Filed: Jan. 21, 1988

[51] Int. Cl.[4] .................. H01L 23/38; H01L 23/44; H01L 23/46

[52] U.S. Cl. ........................................ 357/82; 357/81

[58] Field of Search ................... 357/81, 82; 361/385; 165/80.4

[56] References Cited

U.S. PATENT DOCUMENTS

| | | |
|---|---|---|
| 3,851,221 | 11/1974 | Beaulieu et al. |
| 4,399,484 | 8/1983 | Mayer. |
| 4,450,505 | 5/1984 | Mittal et al. ............... 361/385 |
| 4,468,717 | 8/1984 | Mathias et al. ............ 361/385 |
| 4,694,378 | 9/1987 | Nakayama et al. ........ 165/80.4 |
| 4,706,091 | 10/1987 | Longerich. |
| 4,739,443 | 4/1988 | Singhdeo ................... 361/385 |

Primary Examiner—Andrew J. James
Assistant Examiner—S. V. Clark
Attorney, Agent, or Firm—Robert A. Hays; Michael W. Sales; Wanda K. Denson-Low

[57] ABSTRACT

A very high acceleration tolerant packaging structure 10 for protecting electronic circuit elements such as printed circuit cards 35 or ceramic cards. A rigid housing 15 has at least one planar member 35 for supporting electronic circuitry thereon, mounted within the housing so as to divide the interior of the housing into at least two chambers 50, 52. Each chamber is completely filled with a substantially incompressible fluid 60 so as to leave no air spaces or voids. The fluid in one chamber communicates with the fluid in another chamber only at a controllable rate. Preferably the planar members 35 have substantially the same shape as the cross sectional shape of the interior of the packaging system.

11 Claims, 1 Drawing Sheet

VERY HIGH-ACCELERATION TOLERANT CIRCUIT CARD PACKAGING STRUCTURE

FIELD OF THE INVENTION

This invention relates to a packaging structure for electronic circuit cards, and more particularly to such a structure that will permit such cards to survive very high accelerations (upward of 100,000 g's) applied in any direction with respect to the plane of the circuit card and particularly those applied perpendicular to the plane of the circuit card.

BACKGROUND OF THE INVENTION

There is an increasing amount of work being done in the area of very high acceleration environments, e.g., in the region of 100,000 g's. To date one of the most significant technical challenges is to design an electronics packaging structure including the customary printed circuit cards, ceramic cards, or their equivalent, which will protect the circuit card against structural failure due to the high dynamic loading induced by the high acceleration level. A need has been identified for a packaging structure which can house and protect circuit cards which are subjected to acceleration in excess of 100,000 g's.

SUMMARY OF THE INVENTION

The invention comprises a housing for supporting a plurality of circuit bearing planar structures (such as printed circuit cards) in spaced apart relation with one another whereby chambers are defined between adjacent cards. Each chamber is filled with a substantially incompressible fluid. The fluid in one chamber may flow into an adjacent chamber (e.g., due to thermal expansion) but only at a very low rate controlled by the size of a fluid passageway provided to the planar circuit bearing structure. Each chamber is completely filled with fluid such that no voids or air spaces are present.

BRIEF DESCRIPTION OF THE DRAWING

The only Figure shows a longitudinal cross sectional view of the structure of the high-g tolerant packaging structure of the present invention.

DETAILED DESCRIPTION OF THE INVENTION

Figure 1:
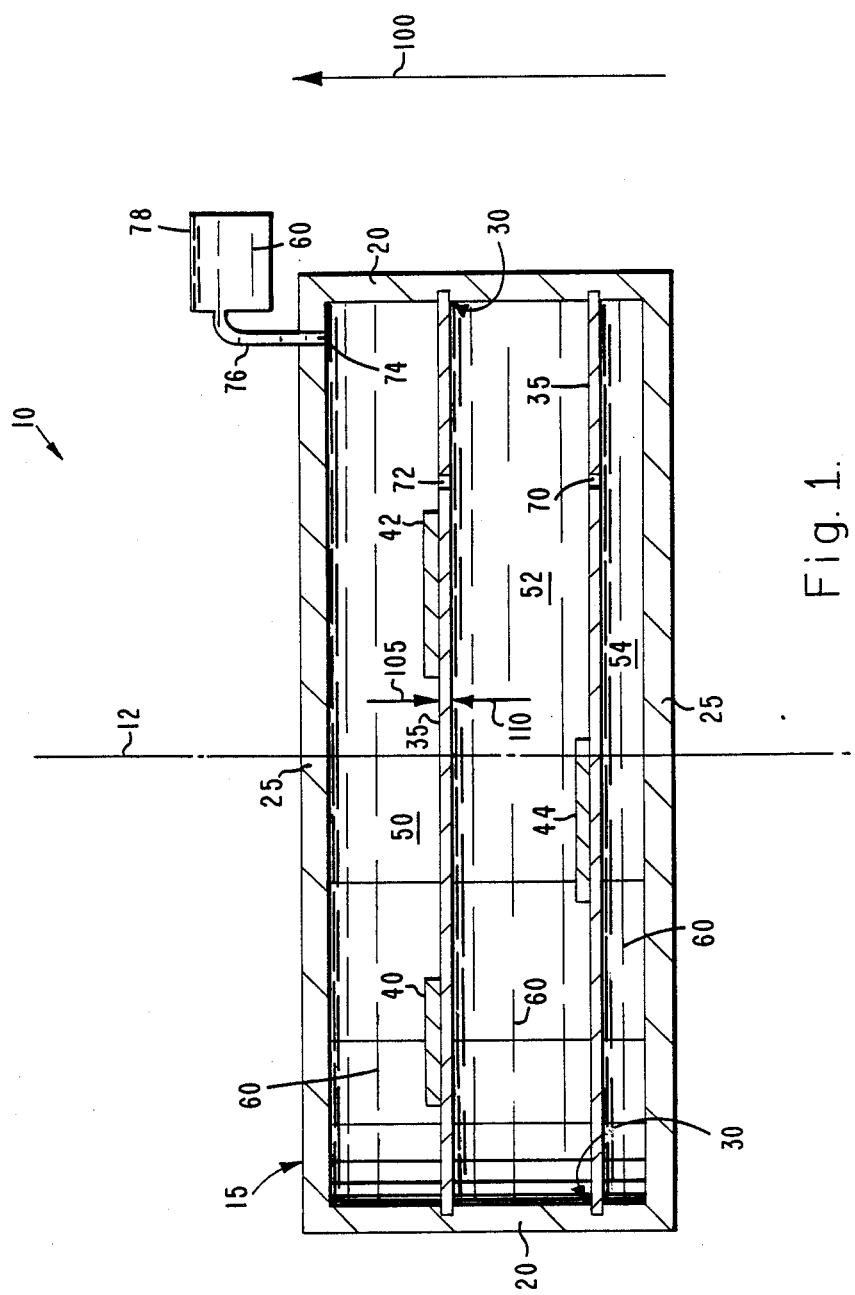

The packaging structure 10 of the present invention comprises an outer housing 15 which may advantageously be cylindrical in shape having a longitudinal axis 12 which may be aligned and coincident with the longitudinal axis of a missile (not shown) in which the structure 10 may be mounted. Housing 15 has rigid longitudinal sidewalls 20 and rigid end wall members 25 as shown in cross section in the Figure. The housing may be constructed of cast aluminum or other suitably rigid material. The sidewalls 20 are provided with suitable means as at 30 for mounting and supporting on the interior of the housing 15, one or more planar members 35 for supporting electronic circuitry. Such planar members 35 may take the form of a printed circuit board, a ceramic board or other suitable means as appropriate for the particular application. The planar members 35 preferably have the same shape as that of the cross section of housing 15 which as shown in the Figure is circular. Mounted upon the planar member 35 may be a plurality of surface mounted electronic packages 40, 42 and 44. Such packages may be discrete circuit elements such as resistors or capacitors, or surface mounted integrated circuit packages or surface mounted semiconductor dies bonded and interconnected directly to the planar member 35. Further, planar member 35 may be a single semiconductor wafer with the electronic circuitry suitably disposed, by methods well known, upon the surface or surfaces of the wafer. There is thus defined between the top end wall 25 and the top planar member 35 a first chamber 50. Between the two planar members 35 there is defined a further chamber 52, and a third chamber 54 is defined between the bottom planar member 35 and bottom end wall 25. Each of the chambers 50, 52 and 54 is filled with a substantially incompressible fluid, 60 such as "Fluorinert" (TM) electronic liquids marketed by the Commercial Chemicals Division of the 3M Company, St. Paul, Minn., 55144. Each chamber is completely filled so as not to leave any voids or air spaces. If electronic packages 40, 42 or 44 are themselves packages having unfilled (i.e., non fluid filled) voids, they must be opened and the void filled with fluid. The chambers and planar members are so formed and mounted that fluid in one chamber is confined to that chamber and does not communicate with the fluid in any other chamber except through very small orifices such as 70, 72. The size of the orifices is very small so that the fluid in one chamber can flow into an adjacent chamber only at a very low rate. The low rate is sufficiently high to allow the fluid to enter and leave the chambers to accommodate thermal expansion of the fluid. The resulting volume accommodation is absorbed by a reservoir 78 which communicates with one of the chambers through connecting line 76 and orifice 74. Orifice 74 is similarly sized to permit only very low fluid flow rates. The fluid flow rates through the orifices must be kept very low so that when the structure is subjected to very high acceleration the fluid cannot be forced rapidly out of the chamber by the tendency of the planar members 35 to bend. If too much fluid was allowed to leave a chamber too quickly, the planar members would then be capable of bending to a sufficient degree that damage would result. Although the packaging structure is intended to survive very high g's, it is understood that the high g's will be of very short time duration. Thus by restricting the rate of fluid flow from one chamber to another, through orifices 70 and 72, to very low rates the amount of fluid transferred between chambers during the duration of the very high g level is very slight and insufficient to result in damage to the planar members 35, but the rate is sufficient to accommodate fluid thermal expansion.

The structure 10 may be subjected to launch conditions which produce an acceleration on the order of 100,000 g's or more as indicated by arrow 100. Simulation analysis indicates that the load upon the planar member 35 which is induced by the acceleration and indicated by arrow 105, is very nearly balanced by the reactive load (indicated by arrow 110) induced by the fluid on the other side of the planar member 35 (Archimede's principle). The buoyancy of the planar member 35 in the fluid 60 will always produce a force or load in the opposite direction as the acceleration induced load indicated by arrow 105 and thus will tend to further balance the loads on the two sides of a planar member.

By choosing a fluid of appropriate density (or adjusting its density by adding suitable higher density micro-spheres to the fluid) and adjusting the density of the planar circuit bearing members, their effective densities may be matched. The planar members 35 would then exhibit neutral buoyancy. With neutral buoyancy the rate at which the fluid is capable of communicating from one chamber to another is not as critical. Because the member 35 and fluid have the same density, the fluid would not tend to flow from one chamber to another under high acceleration. Thus, orifices 70, 72 could be made larger, i.e., sufficiently large to accommodate the purge and fill flow rates.

If the system 10 is subjected to high lateral g's (i.e., acceleration perpendicular to arrow 100 and parallel to the plane of planar members 35) the same principles apply and tend to limit the forces which would otherwise tend to shear packages 40, 42 and 44 from their mounting. Experiments have been conducted on a thin film wafer approximately 2 inches in diameter mounted within a housing also approximately 2 inches in diameter and having sidewalls about 0.25 inches in height. The wafer had components mounted on its surface. The structure was subject to an acceleration of 16,000 g's directed perpendicularly to the plane of the wafer. The wafer and its components survived without any detected damage. Based on the experimental results and simulation based projections, it is projected that such a system as the present invention can withstand very high accelerations exceeding 100,00 g's. Experimental results also indicate that improved results can be obtained with fluids of higher density.

There has thus been described a packaging structure for protecting electronic circuits from damage in a very high acceleration environment. It is understood that various changes and modifications to the packaging structure could be made by one of ordinary skill in the art without departing from the spirit and scope of the invention which is intended to be limited only by the appended claims.

What is claimed is:

1. A very high acceleration tolerant circuit packaging structure comprising:
    a housing, said housing including rigid side walls and rigid end walls;
    at least one planar member for supporting electronic circuitry thereon, said planar member being suitably formed for mounting within said housing, said housing being divided into at least two chambers by said at least one planar member;
    an incompressible fluid, said fluid completely filling all of said chambers; and
    means for compressing for thermal expansion of said fluid said compensating means includes an orifice.

2. The structure as claimed in claim 1 wherein said means for compensating for thermal expansion of said fluid includes at least one orifice extending through each said planar member.

3. The structure as claimed in claim 2 wherein said means for compensating for thermal expansion of said fluid further includes, a housing orifice extending through said housing, said housing orifice extending through said housing being in fluid communication with a reservoir.

4. The structure of claim 1 wherein said housing is cylindrical about an axis perpendicular to said planar members.

5. The structure of claim 1 wherein said housing is a cast aluminum housing.

6. The structure of claim 1 wherein at least one of said planar members is a semiconductor wafer having electronic circuitry disposed thereon.

7. The structure of claim 1 further comprising: a plurality of opened electronic packages, said opened electronic packages being mounted on at least one of said planar members such that voids existing in closed electronic packages are filled by said incompressible fluid.

8. The structure as claimed in claim 1 wherein the density of said incompressible fluid is matched to the density of said planar members such that said planar members exhibit neutral buoyancy within said housing.

9. The structure as claimed in claim 8 wherein said means for compensating for thermal expansion of said fluid includes at least one orifice extending through each said planar member, said orifice being sized to accommodate chamber purge and fill flow rates.

10. The structure as claimed in claim 1 wherein incompressible fluid includes micro-spheres that adjust the density of said incompressible fluid to match the density of said planar members such that said planar members exhibit neutral buoyancy within said housing.

11. The structure as claimed in claim 10 wherein said means for compensating for thermal expansion of said fluid includes at least one orifice extending through each said planar member, said orifice being signed to accommodate chamber purge and fill flow rates.

* * * * *